United States Patent [19]
Weiss et al.

[11] Patent Number: 5,268,573
[45] Date of Patent: Dec. 7, 1993

[54] SYSTEM FOR DETECTING THRESHOLD PHENOMENA ASSOCIATED WITH AND/OR ATOMIC OR MOLECULAR SPECTRA OF A SUBSTANCE

[75] Inventors: Paul S. Weiss; Stephan J. Stranick, both of State College, Pa.

[73] Assignees: The Penn State Research Foundation; Penn State Research Foundation and Biotechnology Research, University Park, Pa.

[21] Appl. No.: 916,165

[22] Filed: Jul. 17, 1992

[51] Int. Cl.$^5$ .............................................. H01J 37/28
[52] U.S. Cl. .................................... 250/306; 250/307; 204/153.1; 204/400; 204/412
[58] Field of Search ............................ 250/306, 307; 204/153.1, 400, 412

[56] References Cited

PUBLICATIONS

"AC Scanning Tunneling Microscopy and Spectroscopy," by Stranick et al., Version Date Aug. 28, 1992.
"Near-Optics; Microscopy, Spectroscopy, and Surface Modification Beyond the Diffraction Limit," by Betzig et al., *Science*, vol. 257, pp. 189-195, Jul. 10, 1992.
"Breaking the Diffraction Barrier: Optical Microscopy on a Nanometric Scale," by Betzig, et al., *Science*, vol. 251, pp. 1468-1470, Mar. 22, 1991.
"Super-Resolution Aperture Scanning Microscope," by Weiss, *Nature*, vol. 237, pp. 510-512, Jun. 10, 1972.
"Scanning Surface Harmonic Microscopy: Scanning Probe Microscopy Based on Microwave Field-Induced Harmonic Generation," by Michel et al., *Rev. Sci. Instrum.*, 63(9):4080-4085, Sep. 1992.
G. Kochanski, "Nonlinear Alternating-Current Tunneling Microscopy," *Physical Review Letters*, 62(19):2285-2288 (May 8, 1989).
G. Kichanski, "Nonlinear Alternating-Current Tunneling Microscopy" (AT&T Preprint (Aug. 17, 1988), published in *Physical Review Letters*, 62 (19):2285-2288 (May 8, 1989).
W. Seifert et al., "Scanning Tunneling Microscopy At Microwave Frequencies," *Ultramicroscopy* 42-44; 379-387 (1992).
W. Seifert et al., [Preprint paper], "Scannning Tunneling Microscopy at Microwave Frequencies," Korrigierte Version (Nov. 6, 1991) published in *Ultramicroscopy* 42-44; 379-387 (1992).
D. Anselmetti et al., H.-J. Güntherodt R. Weisendanger (Eds.) "Scanning Tunneling Microscopy I," pp. 5-6.
L. Arnold et al., "Laser-Frequency Mixing Using the Scanning Tunneling Microscope," *J. Vac. Sci. Technol.*, A, 6(2): 466-469 (Mar./Apr., 1988).

(List continued on next page.)

Primary Examiner—Jack I. Berman
Attorney, Agent, or Firm—Majestic, Parsons, Siebert & Hsue

[57] ABSTRACT

A microwave sweep oscillator is used to apply an AC signal cross a scanning tunneling microscope and the current or voltage passing between the electrodes is measured by a microwave spectrum/network analyzer. The frequency of the signal applied by the oscillator may be swept across a spectrum and the optimum frequency of the spectrum is determined so that an improved image of the surface of a sample may be obtained. The spectrum of a known substance may also be recorded and used as a signature for identifying components of an unknown substance by comparison. When the amplitude of the AC signal applied is increased, a sudden change in the response indicates a threshold. By reducing the amplitude, the frequency response will indicate charge dissipation characteristics of the sample. When applied to electrochemical cells, this invention is particularly useful for measuring dynamic information of the electrochemical cell. When applied to a Coulomb blockade device, charging thresholds and charge dissipation rates can be measured.

24 Claims, 8 Drawing Sheets

PUBLICATIONS

L. Arnold et al., "Laser-Frequency Mixing in the Junction of a Scanning Tunneling Microscope," *Appl. Phys. Lett.*, 51(11):786–788 (Sep. 14, 1987).

M. Völcker et al., "Laser-Driven Scanning Tunneling Microscope," *Phys. Rev. Lett.*, 66(13):1717–1720 (Apr. 1, 1991).

D. Cahill et al., "Scanning Tunneling Microscopy of Photoexcited Carriers at the Si(001) Surface," *J. Vac. Sci. Technol.*, B, 9(2):564–567 (Mar./Apr. 1991).

R. Hamers et al., "Atomically Resolved Carrier Recombination at Si (111)—(7×7) Surfaces," *Phys. Rev. Lett.*, 64(9):1051–1054 (Feb. 26, 1990).

Y. Kuk et al., "Optical Interactions in the Junctio of a Scanning Tunneling Microscope," *Phys. Rev. Lett.*, 65(4):456–459 (1990).

Y. Kuk et al., "Optical Interactions in the Junction of a Scanning Tunneling Microscope," [Preprint] published in *Phys. Rev. Lett.*, 65(4):456–459 (1990).

K. Likharev, "Correlated Discrete Transfer of Single Electrons in Ultrasmall Tunnell Junctions," *IBM J. Res. Develop.*, 32(1):144–158 (Jan. 1988).

K. Likharev et al., "Single Electronics," *Scientific American*, Jun. 1992.

C. Andrieux et al., "Ultramicroelectrodes: Cyclic Voltammetry Above One Million V s$^1$", *J. Electroanal. Chem.*, 248:447–450 (1988).

R. Wightman et al., "High-Speed Cyclic Voltammetry," *Acc. Chem. Res.*, 23:64–70 (1990).

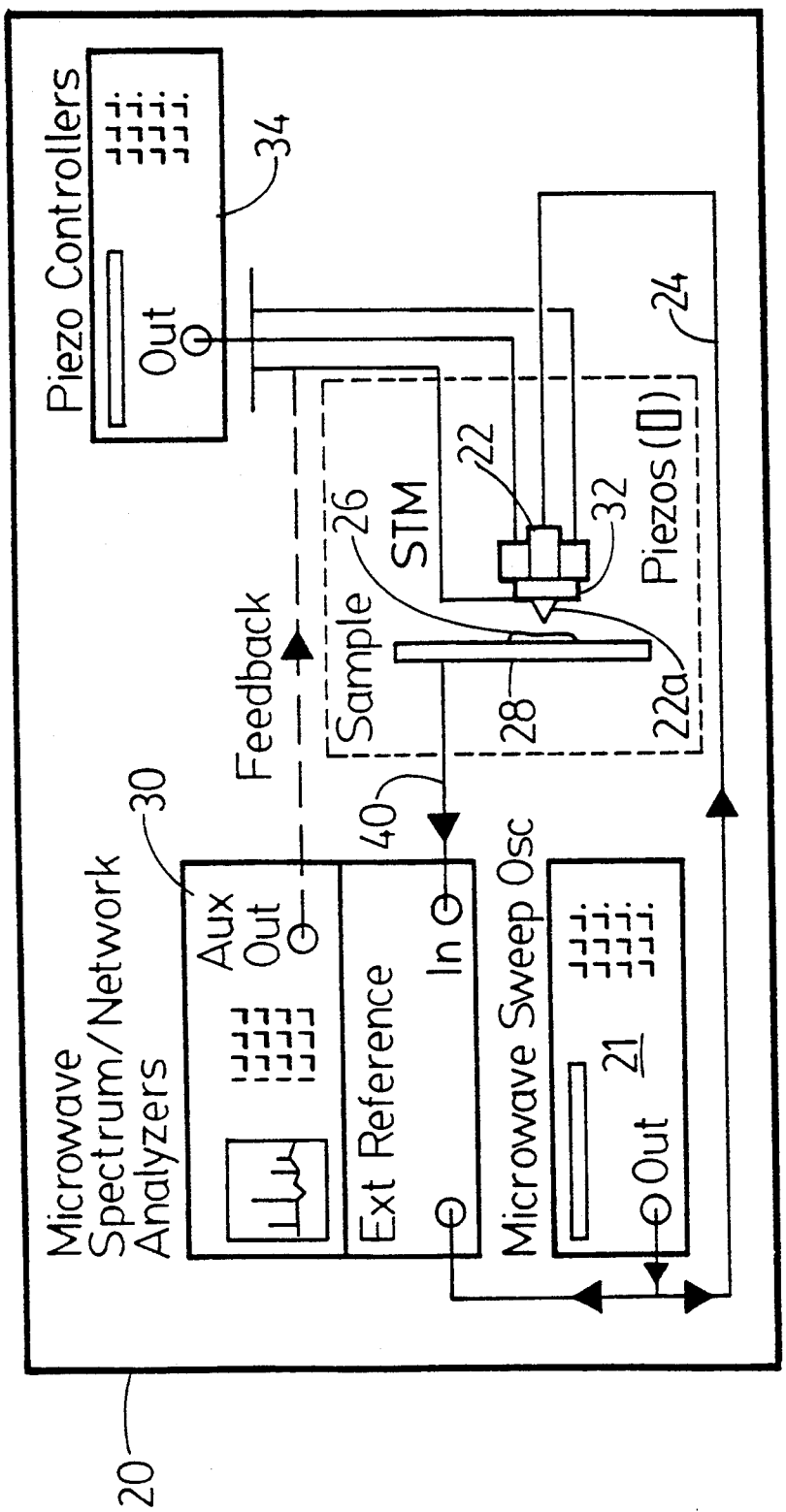
FIG._1.

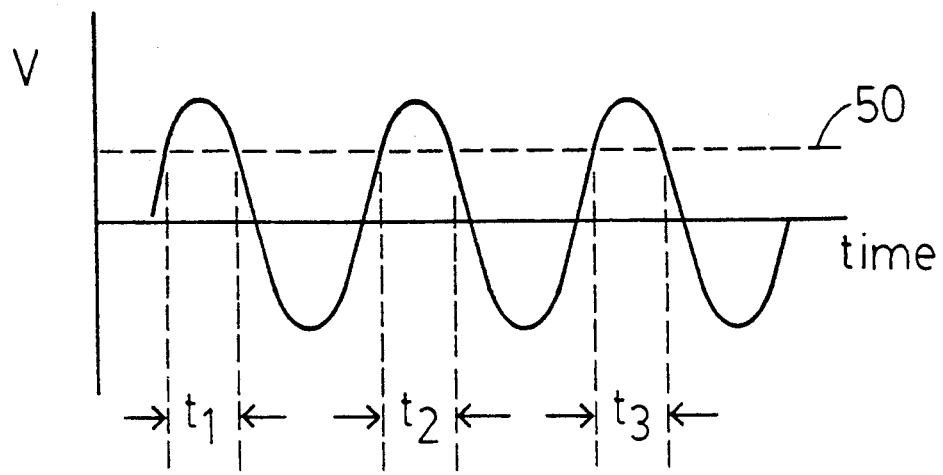
FIG._2A.
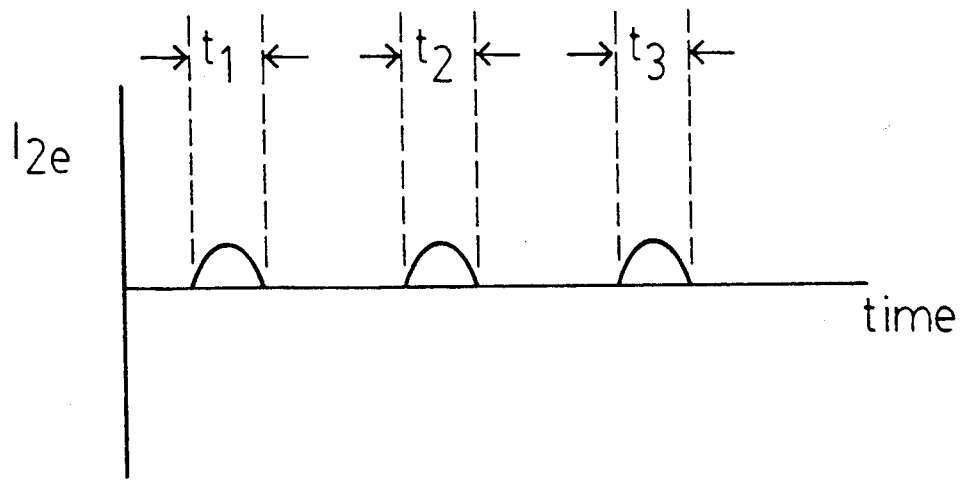
FIG._2B.

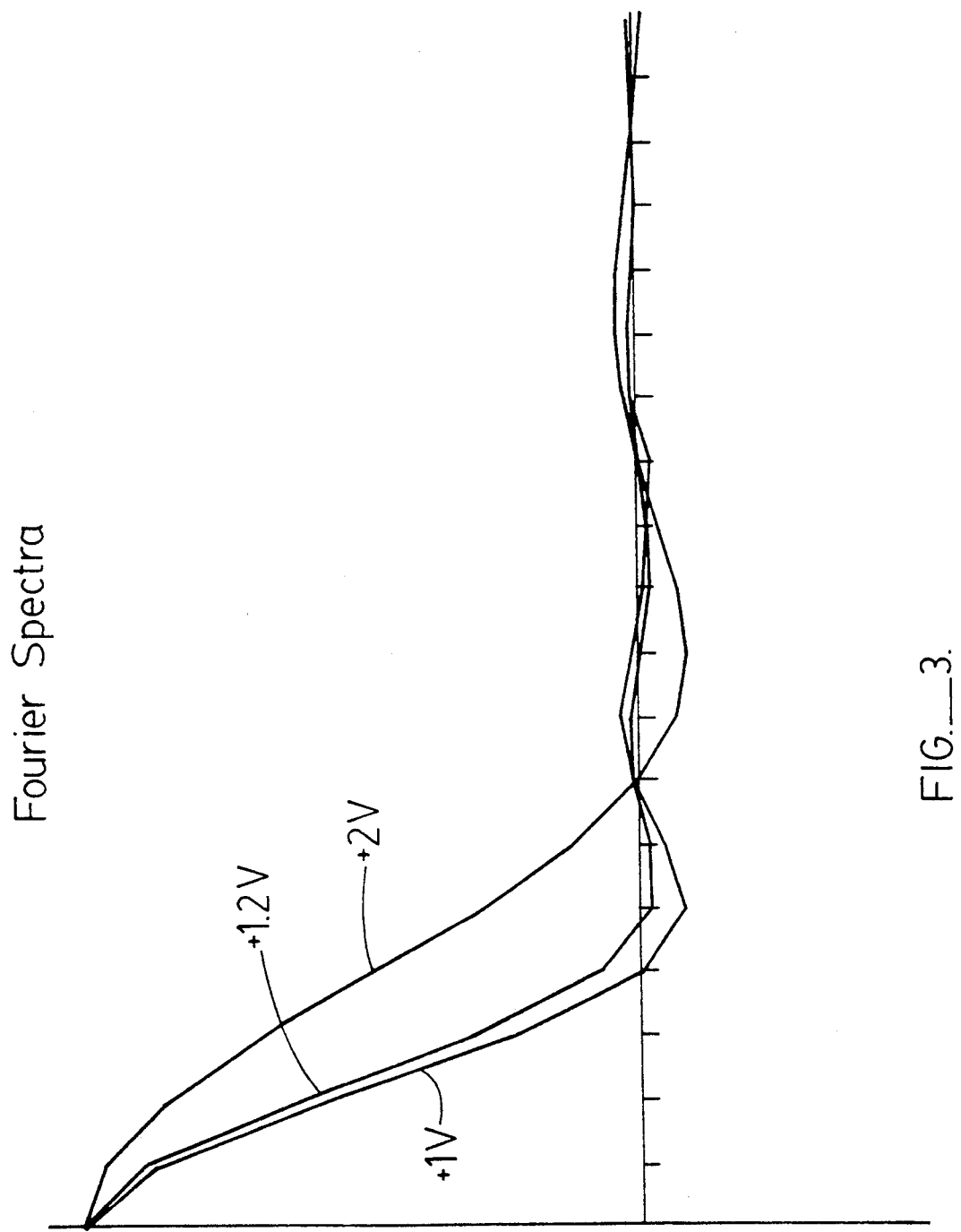
FIG._3.

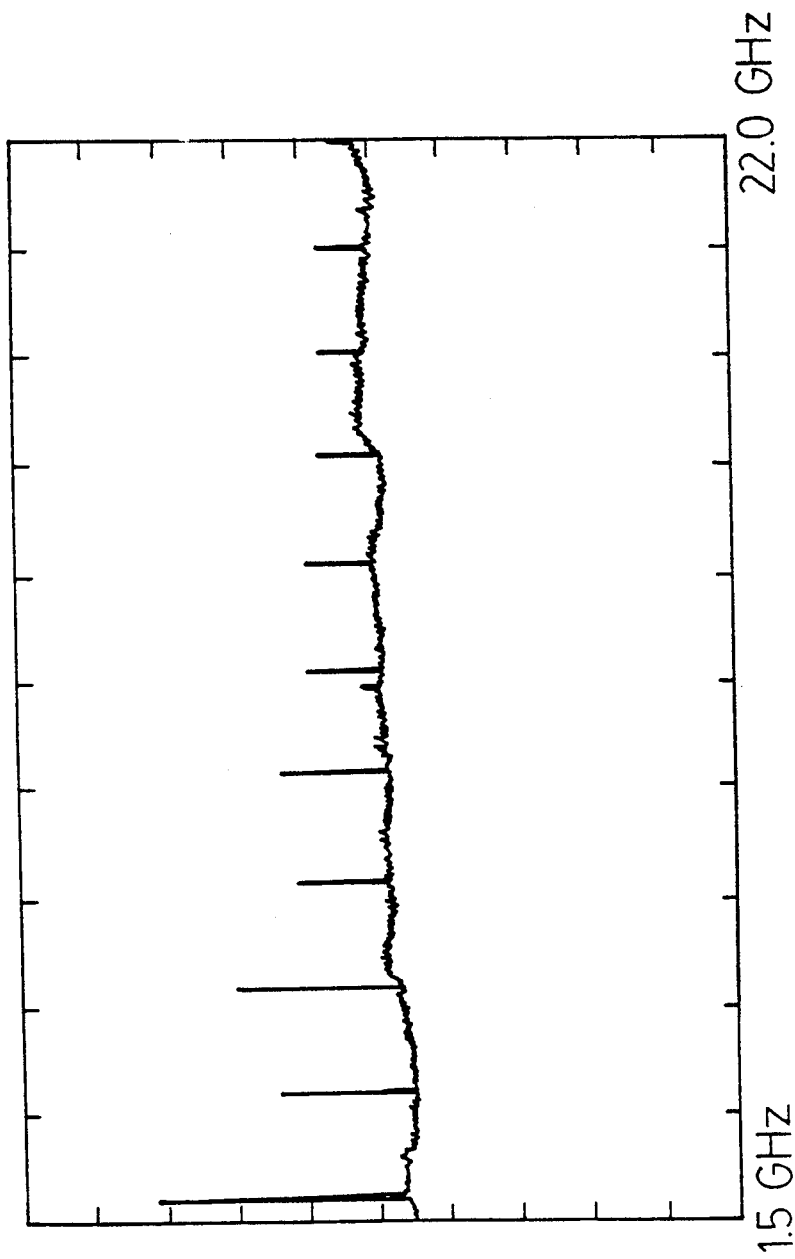
FIG._4.

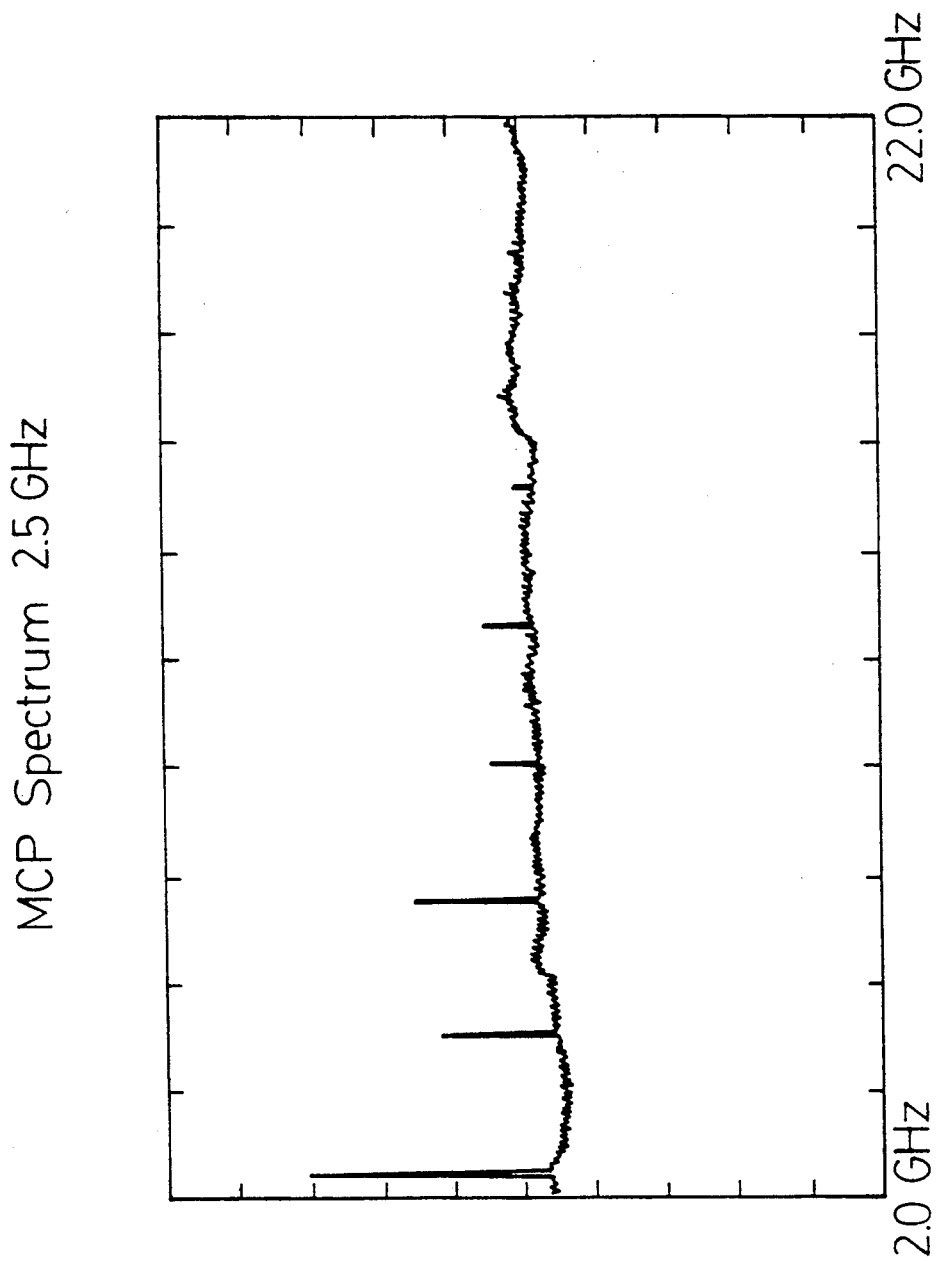
FIG._5.

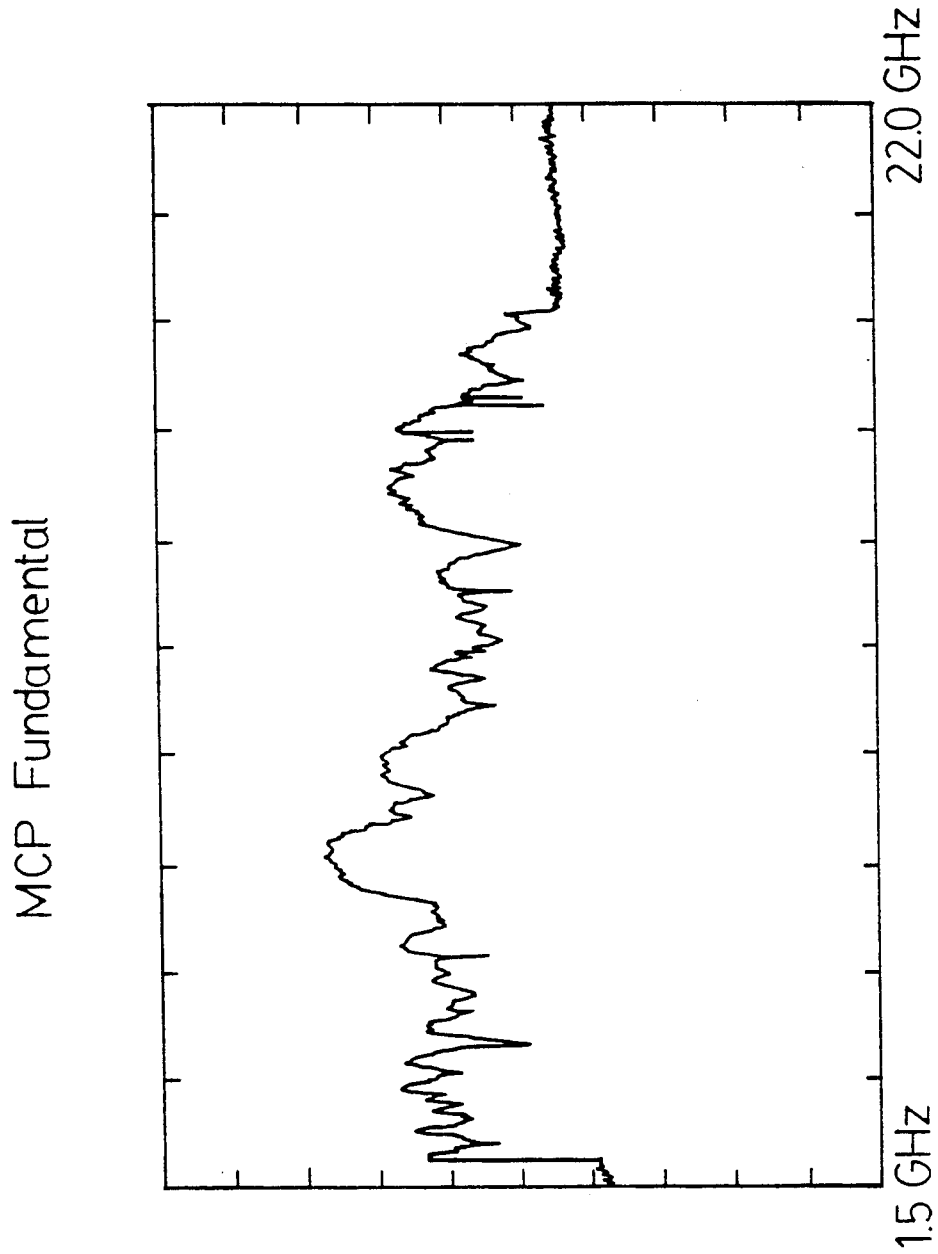
FIG._6.

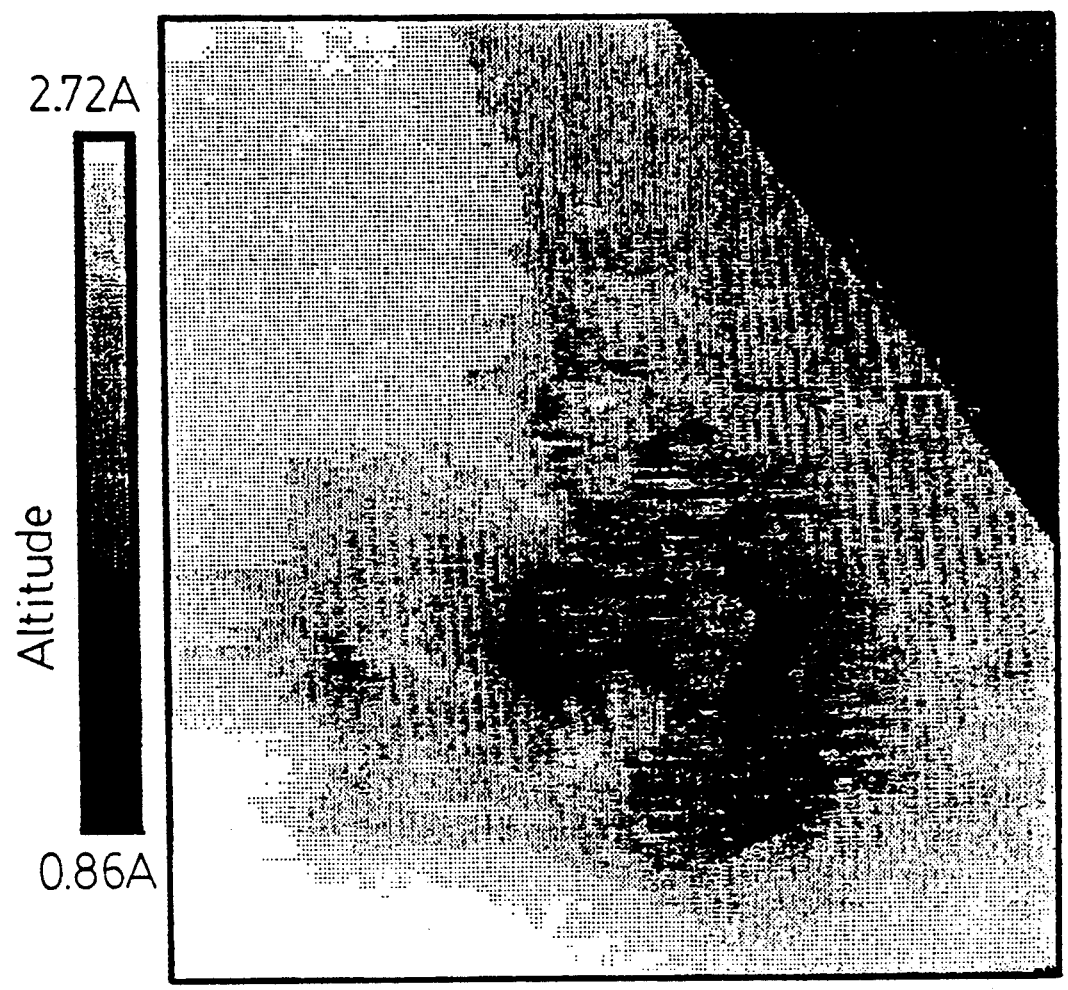
FIG._7.

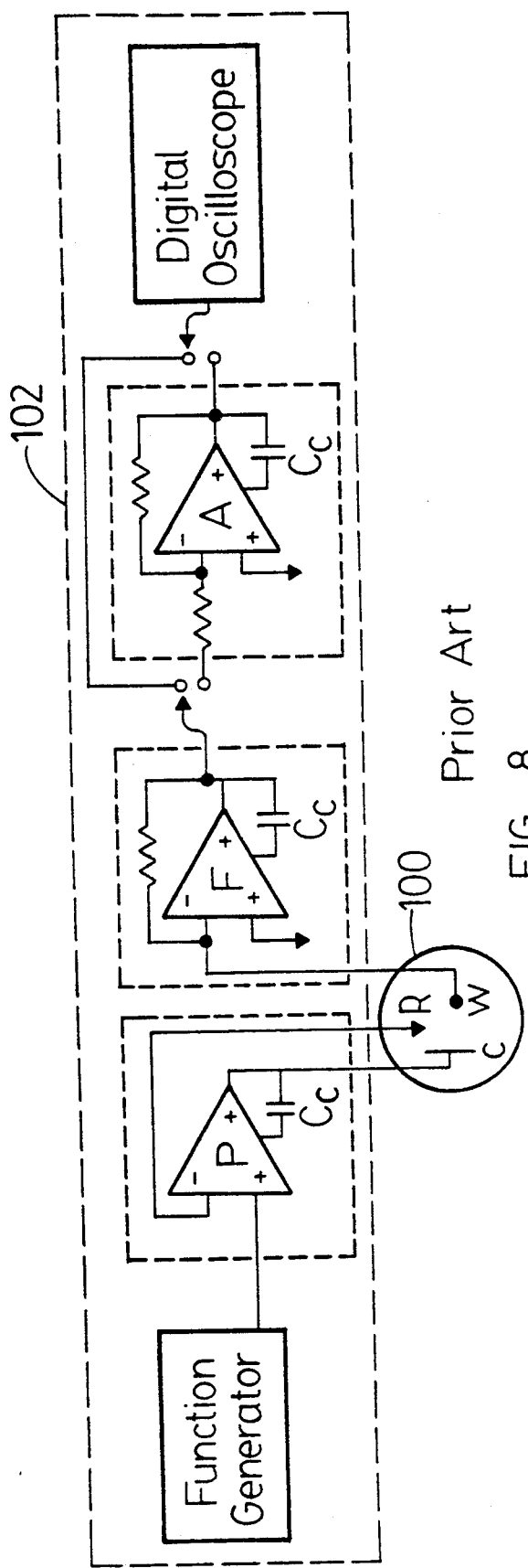
FIG._8.
Prior Art
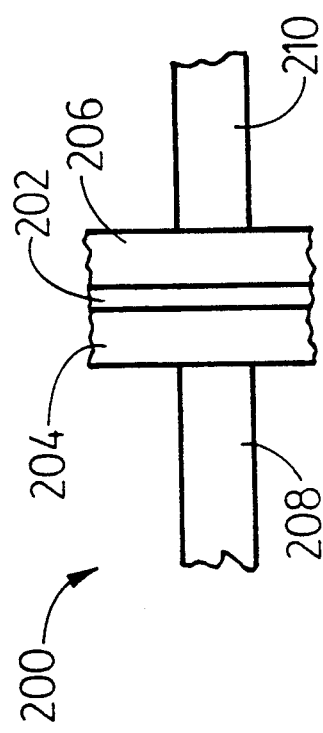
FIG._9.

SYSTEM FOR DETECTING THRESHOLD PHENOMENA ASSOCIATED WITH AND/OR ATOMIC OR MOLECULAR SPECTRA OF A SUBSTANCE

This invention was made with support from the National Science Foundation, United States Government, under Grant No. CHE-9158375. The government has rights in this invention.

BACKGROUND OF THE INVENTION

This invention relates to a system for detecting the threshold and spectra of substances at the atomic or molecular level.

With the advent of instruments such as the scanning tunneling microscope (STM), it is now possible to investigate the structure, spectra and dynamics of biological molecules and membranes as well as other substances at the atomic or molecular level. While more than a thousand STM's have been in operation and the instrument has sparked great interest in spectroscopy, the actual headway that has been made in this area remains rather modest. Thus, Bob Wilson and co-workers at IBM Almaden have made some progress in distinguishing closely related adsorbed surface species in STM images. G. Meijer et al., *Nature* 348, 621 (1990). In "Non-Linear Alternating-Current Tunneling Microscopy," Kochanski, *Physical Review Letters*, 62:19, pp. 2285–2288 (May 1989), a method for scanning tunneling microscopy is described, where a non-linear alternating current (AC) technique is used that allows stable control of a microscope tip above insulating surfaces where direct current (DC) tunneling is not possible.

The STM has a counter electrode on which the sample to be investigated is placed and another electrode in the shape of a microscope probe with a tip placed at a small distance away from the sample surface. A DC or a low frequency AC signal is then applied across the pair of electrodes. The probe tip is then moved across the sample surface in a scanning operation and the changes in the current or voltage across the electrodes are monitored to detect the characteristics of the sample.

The distance between the probe tip and the counter electrode/sample is controlled by a piezoelectric driver in one of two possible modes: a constant current mode and a constant height mode. The current or voltage detected between the pair of electrodes is used to derive a control signal for controlling the piezoelectric driver in the constant current mode to change the distance between the probe tip and the sample so as to maintain a constant current between the electrodes. The voltage that has been applied to the piezoelectric driver in order to keep the tunneling current constant indicates the height of the tip z(x,y) as a function of the position (x,y) of the probe tip over the sample surface. A record of such voltages therefore indicates the topographical image of the sample surface. The constant current mode can be used for surfaces which are not necessarily flat on an atomic scale. A disadvantage of the constant current mode is the time required for the feedback loop for controlling the piezoelectric driver; this feedback action sets relatively low limits for the scan speed.

To increase the scan speed considerably, the feedback loop response is slowed or turned off completely so that the probe tip is rapidly scanned at a constant distance to the counter electrode irrespective of the contours of the sample surface. The rapid variations in the tunneling current are recorded as a function of location (x,y) to yield the topographic information of the sample surface. This is known as the constant height mode referring to the fact that the probe tip is maintained at a constant distance from the counter electrode.

The constant height mode is advantageous over the constant current mode since it has a faster scan rate not limited by the response time of the feedback loop. Consequently, slow dynamic processes on surfaces can be studied. On the other hand, it is more difficult to extract the topographic height information from the variations of the tunneling current. Furthermore, unless the sample is atomically flat, the tip might crash into a surface protrusion of the sample. For a more complete description of the two operating modes of the STM's, please see "Scanning Tunneling Microscopy I," by H. J. Güntherodt R. Wiesendanger (Eds.), Springer-Verlag, pp. 5–6.

In the article referenced above, Kochanski proposes to investigate insulating films by applying an AC current between the electrodes at frequency $\omega$ and the current between the electrode at $3\omega$ is detected. The AC signal is generated using a 2 GHz resonant cavity so that the frequency or frequencies of the signal applied to the STM electrodes and detected must be fixed in the scanning operation performed by Kochanski.

SUMMARY OF THE INVENTION

One aspect of the invention is directed to an apparatus for detecting threshold phenomena associated with and/or atomic or molecular spectra of a substance. The apparatus comprises a source for providing an AC signal and at least two electrodes for coupling the signal across a substance. The apparatus further comprises means connected to at least one of the electrodes for measuring the amplitudes of the current or voltage across the electrodes over a predetermined spectrum of frequencies to detect threshold phenomena associated with and/or atomic or molecular spectra of the substance.

Another aspect of this invention is a method used for detecting threshold phenomena associated with and/or atomic or molecular spectra of a substance by means of a pair of electrodes across the substance. The method comprises providing an AC electrical signal to the electrode(s) and measuring the amplitudes of the current or voltage across the electrodes over a predetermined spectrum of frequencies to detect threshold phenomena associated with and/or atomic or molecular spectra of the substance.

This above aspect of the invention is based on the observation that threshold phenomena associated with and/or atomic or molecular spectra of a substance can be investigated by detecting the current or voltage across the electrodes of the STM at frequencies over a predetermined spectrum of frequencies simultaneously instead of at only a single frequency as in Kochanski's work. Instead of detecting at different frequencies simultaneously, it is possible to detect at these frequencies sequentially as well.

Furthermore, in the preferred embodiment, if a tunable source (e.g., between about 1–30 GHz) is used for providing the AC signal applied across the electrodes, the frequency of the AC signal applied may be tuned to an optimal value for measuring the amplitudes of the current or voltage over the predetermined spectrum. In addition, by varying the frequency of the electrical signal applied across the electrodes, it is possible to detect rates of motion of charges, or structural rearrangements, in the sample or substance tested.

According to another aspect of the invention, the frequency of the AC signal is maintained substantially constant but the amplitude of the signal is varied and the current or voltage at a selected frequency is monitored so that a sudden change in current or voltage indicates a threshold of the substance. After the optimal frequency of the electrical signal to be applied is determined, the tunable source is preferably tuned to such frequency and the STM may then be used to scan a sample for differentiating different surface species or for obtaining images of the surfaces of the sample.

The system of this invention is applicable not only to STM's but also to other detection schemes such as the Coulomb blockade device for measuring threshold phenomena or rates of electrical charges in the device, and to electrochemical cells for detecting dynamic information concerning electrochemical changes. In the preferred embodiment, a spectrum analyzer or a network analyzer is used for measuring the amplitudes of current or voltage across the electrodes over a predetermined spectrum of frequencies. Where the amplitudes of the current or voltage at the fundamental frequency of the AC electrical signal applied are measured, a network analyzer is used to perform the measurements.

BRIEF DESCRIPTION OF THE DRAWINGS

FIG. 1 is a schematic diagram of a high frequency STM for imaging insulator surfaces using throughput attenuation with a network analyzer, or using non-linear harmonic recording with a spectrum analyzer.

FIG. 2A is a graphical illustration of the modulated bias voltage used in the apparatus of FIG. 1 over time, where the dashed line shows the voltage threshold for a second electron to hop to (or from) the surface.

FIG. 2B is a graphical illustration of the resulting current due to the effect of the second electron versus time when the bias voltage of FIG. 2A is applied in the apparatus of FIG. 1.

FIG. 3 is a graphical illustration of the Fourier spectra detected when an AC signal is applied across a substance to be measured. The Fourier spectra includes three different graphs for three different substances having different thresholds.

FIG. 4 is a graphical illustration of the ratio of the current or voltage measured to the voltage or current applied to the STM electrodes across a predetermined spectrum when an AC signal of 2 GHz is applied across a substance.

FIG. 5 is a graphical illustration of the ratio of the current or voltage measured to the voltage or current applied to the STM electrodes across a predetermined spectrum when an AC signal of 2.5 GHz is applied across a substance.

FIG. 6 is a graphical illustration of the ratio of the current or voltage measured at the fundamental frequency to the voltage or current applied to the STM electrodes at the fundamental frequency to electrodes across a substance.

FIG. 7 is a plot of the alternating current STM image of the edge of a pore on a surface showing the microscopic details of the surfaces scanned.

FIG. 8 is a schematic diagram of an electrochemical cell and a circuit diagram of a potential controlling and current measuring instrument for monitoring the electrochemical cell in a conventional arrangement.

FIG. 9 is a schematic diagram of a Coulomb blockade device to illustrate the invention.

DETAILED DESCRIPTION OF THE PREFERRED EMBODIMENT

FIG. 1 is a schematic diagram of a system 20 including a high frequency scanning tunneling microscope for imaging samples using throughput attenuation with a network analyzer, or using non-linear harmonic recording with a spectrum analyzer to illustrate the preferred embodiment of the invention. As shown in FIG. 1, a microwave sweep oscillator 21 generates an AC signal and applies it to microscope probe 22 with tip 22a through line 24. Tip 22a is placed close to but spaced apart (by vacuum, a gas or a fluid) from a sample 26 which is placed on top of the counter electrode 28. Counter electrode 28 is connected to microwave spectrum/network analyzers 30. The position of the probe tip 22a over sample 26 is controlled by piezoelectric crystal 32 which is in turn controlled by piezo controllers 34. Controllers 34 receive from analyzers 30 a signal to be used for feedback.

In operation, the microwave sweep oscillator 21 applies the AC signal to tip 22a and analyzers 30 applies typically a reference voltage such as a virtual ground to counter electrode 28. The current or voltage between electrodes 22, 28 is monitored by analyzers 30 which derives a feedback signal for controlling controllers 34. In the constant current mode, this feedback signal is applied to the piezo controllers 34 for moving the tip 22a away from or towards the sample 26 in order to maintain a constant signal amplitude between electrodes 22, 28. In constant height mode, the distance between tip 22a and counter electrode 28 is maintained at a constant value and the feedback signal derived from the output of analyzers 30 is either not applied to controllers 34 or attenuated to a very low value before it is applied to controllers 34.

The scheme in reference to FIG. 1 differs from Kochanski's described above in that a tunable source is used to generate the AC signal applied across the electrodes and the amplitudes of the current or voltage can be measured simultaneously at frequencies within a predetermined spectrum using the analyzers. Analyzers 30 then compute the ratio between the amplitudes of the current or voltage measured to the amplitudes of the voltage or current applied by oscillator 21 to probe 22 at frequencies over a predetermined range or spectrum. Where the amplitudes are measured using a network analyzer, both the amplitudes and phases of current or voltage can be measured and used for imaging or spectroscopy.

When a voltage is applied across electrodes 22, 28, depending on the threshold of the substance in sample 26 at the position of the tip 22a and the distance between sample 26 and the tip 22a, electrons may tunnel between tip 22a and the sample. Such tunneling phenomena has been the subject of studies, one of which is set forth in the article "Single Electronics," by Likharev et al., *Scientific American*, pp. 80-85 (June 1992). As noted by Likharev et al., the application of a voltage across an insulating layer will cause a surface charge Q to build up across the barrier. When an electron tunnels through the insulating layer, the surface charge Q will change exactly by $+e$ or $-e$, depending on the direction of tunneling, where e is the electrical charge of a single electron. If the charge Q at the junction is greater than $+e/2$, an electron can tunnel through the junction in a particular direction, subtracting e from Q. The electron will tunnel in the opposite direction if the charge Q is less than $-e/2$. If Q is less than $+e/2$ and greater than $-e/2$, tunneling in any direction would increase the energy of this system. If the initial charge is within this range, tunneling would not occur and this suppression of tunneling is known as Coulomb blockade.

If the surface charge Q falls outside the range for Coulomb blockade so that electron tunnels through the insulating layer, which may cause the surface charge Q to f all within such range again. In such event, further tunneling is not possible. This is caused by the effect of the electric field exerted by the electron which has tunneled through on other electrons which may follow in its path.

The effect of applying a sinusoidal voltage across two electrodes separated by an insulating layer is shown in FIG. 2A. Thus, when the voltage applied exceeds a certain threshold 50 shown in dotted line in FIG. 2A, this causes the surface charge across the insulating layer to exceed the Coulomb blockade range. Thus, it is only during the time periods t1, t2, t3 that more than one electron per cycle will tunnel through the insulating layer to cause the current flow as shown in FIG. 2B.

This invention is based on the observation that the threshold voltage of the substance in the sample can be determined by measuring the amplitudes of the current or voltage across electrodes over a predetermined frequency spectrum. Also, by inverse Fourier transform from the frequency domain to the time domain, graphs such as those in FIG. 2B can be obtained for determining the threshold of the substance in the sample. The Fourier spectra of three different substances with respective thresholds of 1 volt, 1 and 2 volts, and 2 volts are illustrated in FIG. 3. Thus, by performing an inverse Fourier transform of the three spectra, the respective thresholds of 1 volt, 1 and 2 volts, and 2 volts can be obtained. In this connection, FIG. 4 is a graphical illustration of a spectrum of a substance when a 2 GHz signal is applied by oscillator 20 across electrodes. FIG. 5 is a graphical illustration similar to that of FIG. 4 except that the oscillator applies an AC signal of 2.5 GHz instead of 2 GHz.

As illustrated in FIGS. 2A, 2B, when the amplitude of the AC signal applied across the electrodes is varied, such as where the amplitude is continually increased, one will see a sudden increase in the current flow between the electrodes when a threshold is reached. This will cause a sudden change in current and voltage across the electrodes which can be detected to indicate the presence of a threshold. This may be accomplished by comparing the amplitudes of the high harmonics to those of the low harmonics of the driving frequency of oscillator 21. When the amplitude of the AC signal applied across the electrodes is varied by gradually reducing the amplitude, the surface charge buildup on one side of the insulating barrier caused by the tunneling electrodes would tend to dissipate because of the mutual repulsion of the electrons. The dissipation rate of the electrons will reveal the rates of motion of charges in the substance, and the charge transport characteristics of the substance. When the amplitude of the signal is varied, the frequency of the signal is preferably kept substantially constant.

Oscillator 21 may be used to provide different frequency input AC signals across the electrodes. The amplitudes of the current or voltage across the electrodes may be measured as described above to obtain the spectra such as those shown in FIGS. 3-5 for different frequency input signals. Preferably, the amplitude of the signal provided in the above procedure remains substantially unchanged when the frequency of the signal provided by oscillator 21 is varied. From the various spectra obtained, an optimum value may be obtained for the frequency of the signal applied by oscillator 21, such as one which maximizes the signal detected. FIG. 6 illustrates such a feature. FIG. 6 shows the frequency response at the fundamental for tip 22a at the same spot of the sample. In other words, FIG. 6 is a plot of the ratio of the amplitude at the fundamental frequency of the current or voltage measured to the amplitude of the voltage or current applied to the electrodes, as the fundamental frequency of the signal applied by oscillator 21 is swept from 1.5 to 22 GHz. In other words, if the frequency response at the fundamental frequency is measured as the frequency of the applied signal sweep, the optimum frequency is indicated by the peak of the curve in FIG. 6 at about 7.7 GHz. This indicates that when the input signal is at such frequency, the signal recorded is maximum at the fundamental frequency. Obviously, the amplitudes at frequencies other than the fundamental may be used instead and are within the scope of the invention. FIG. 6 is obtained by sweeping the fundamental frequency supplied by the oscillator 21 under control of the analyzer 30, although this frequency can also be swept independently.

Once the optimum frequency is discovered, oscillator 21 may be tuned to such frequency and the STM is used in an otherwise conventional manner in either the constant current or constant height mode for differentiating surface species or for obtaining images of the surfaces of a substance or sample. By selecting particular frequencies which allow contrast between different surface species, the AC STM can be used to generate a map of the chemical species on the surface.

It is important to determine the spectral match (or lack thereof) between measurements of a known species and an unknown. The information may be used to determine the surface composition of one area versus another, or to intercompare an unknown with a previously characterised sample. Samples that can be visually intercompared with known spectra for identification purposes are the simplest case. If the differences are more subtle, a mathematical convolution of the known and unknown to highlight the differences assists the user to see the degree of agreement or lack thereof between the spectra. There are cases where the spectra are qualitatively very similar, or the signal to noise ratio is poor, or it is desired to to have a numerically based recognition of match. A statistical intercomparison of the spectra can be used to differentiate an unknown amongst a wide range of candidates. There are many approaches. Amongst them are the least square distance between spectra or a calculation of the eigenvector distance between spectra in n-dimensional space.

Where the amplitudes of the current or voltage are to be measured at a fundamental frequency, a network analyzer is used. Where measurement of amplitudes at different frequencies across an entire spectrum is desired, a spectrum analyzer is used.

FIG. 7 shows an image obtained of an edge of a pore on the surface using an STM employing the system of the invention. Since the invention functions at the atomic or molecular level, it is possible to detect and measure surface species and other local phenomena.

The concept of this invention can be used not only for application to STM but also to other technologies including Coulomb blockade applications and electrochemical applications.

This invention is particularly useful for detecting fast electrochemistry. This is useful for analyzing electrochemically generated species before they diffuse away from the electrode at which they are generated and/or undergo subsequent reaction. It is also possible to analyze chemical species where the electrochemical environment is rapidly changing, such as in electrochemical probing of living cells. Fast electrochemistry can also be used to determine reaction rates and mechanisms. By using a very high modulation frequency, it is possible to measure extremely small numbers of molecules at very small electrodes by being able to measure a signal from each molecule present repeatedly as a form of signal amplification.

FIG. 8 is a schematic view of an electrochemical cell and a circuit of a potential controlling and current measuring instrument for monitoring the cell in a conventional arrangement taken from "Ultramicroelectrodes: Cyclic Voltammetry Above One Million V $s^{-1}$," by Andrieux et al., *J. Electroanal. Chem.*, 248:447-450 (1988). As shown in FIG. 8, electrochemical cell 100 is monitored by circuit 102 having counter electrode C, reference electrode R, and working electrode W. The scheme in FIG. 8 can be readily modified so that a concept of the invention may be applied thereto. In reference to FIGS. 1 and 8, the working electrode W is connected to analyzers 30 in the same way as counter electrode 28 of FIG. 1. The output of oscillator 21 is applied to counter electrode C and reference electrode is connected to analyzers 30. Then the above-described operation for the STM may be adapted for measuring the fast electrochemistry of cell 100.

By using a very small working electrode, the capacitance of the bilayer (the molecules aligned at the electrode surface) is reduced, thereby reducing the associated RC time constant of the electrochemical cell 100 in order to increase the speed of the measurement. In reference to FIG. 8, a high frequency AC signal with or without a DC bias is applied to the counter electrode and the frequency spectrum at the current at the working electrode is sensed. The frequency spectrum obtained from such measurements will reflect the current-/voltage curves, since the current/voltage characteristics of the electrochemical cell are highly non-linear. Working at high frequency will outrun certain processes such as diffusion of electrochemically generated species away from the electrode. The DC bias can also be set to a feature of interest in the current/voltage characteristic of the electrochemical cell. Then by varying the modulation frequency, the rate of the electrochemical process can be monitored.

FIG. 9 is a schematic view of a Coulomb blockade device 200 sandwiched between two conductive layers 204, 206 connected respectively to electrodes 208, 210. Again the dotted line box in FIG. 1 is replaced by the coulomb blockade device 200 of FIG. 9 so that the general scheme of FIG. 1 may be used for monitoring the Coulomb blockade device 200. More specifically, electrode 208 may be connected to the network analyzers 30 through conductor 40 and electrode 210 may be connected to oscillator 21 through conductor 24. The scheme of FIG. 1 can then be used for measuring thresholds and charge dissipation rates in a manner similar to that described above for the STM. The thresholds are measured by varying the amplitude of the applied AC signal. When the amplitude is increased and a threshold is reached, only the peak of the sine wave will be at sufficient amplitude to transfer a second, third . . . electron across the insulating barrier 202. Thus, there will be a signal that is a fairly sharp feature in time. Short time features such as these correspond to high frequencies. An increase in the higher harmonics as this threshold is surpassed is expected. As the amplitude is further increased, the time period over which the sine wave amplitude is over the threshold is increased. This gives a more slowly varying signal, so that the amplitude of the higher harmonics decreases relative to the lower harmonics. If the amplitude of the current or voltage across the electrodes 208, 210 are monitored at frequencies within a spectrum, the spectra obtained may be transformed using Fourier transform to obtain the threshold. Alternatively, if simply an indication of the threshold is needed, the sudden change in current or voltage across the electrodes 208, 210 will be adequate.

To measure the charge dissipation rates across device 200, after the thresholds are known, the modulation frequency is varied with the amplitude held constant. If charge escapes during a period, then the threshold (which is due to repulsion from the previous tunneled charge) disappears as does the corresponding nonlinearity. The higher harmonics would then decrease as the signature that the dissipation is taking place on the time scale of the modulation. Again, by comparing the amplitudes of the high harmonics to those of the low harmonics of the driving frequency, such dissipation can be detected. This is the case also when a sample or an electrochemical cell is measured using a STM.

Since different molecules or particles will exhibit different spectra, it is possible to record the atomic or molecular spectra of a known substance to be a signature for comparison with atomic or molecular spectra of an unknown substance detected using the scheme above. The comparison will yield useful information on the composition of the unknown substance.

While the invention is described above in reference to various embodiments, it will be understood that various changes and modifications may be made without departing from the scope of the invention which is to be limited only by the appended claims.

WHAT IS CLAIMED IS:

1. An apparatus for detecting threshold phenomena associated with and/or atomic or molecular spectra of a substance, comprising:
    a source for providing an AC electrical signal;
    at least two electrodes for coupling said signal across a substance; and
    means connected to at least one of the electrodes for measuring the amplitudes of the current or voltage across the electrodes over a predetermined spectrum of frequencies to detect threshold phenomena associated with and/or atomic or molecular spectra of the substance.

2. The apparatus of claim 1, wherein said source provides an electrical signal having frequencies above about 1 GHz.

3. The apparatus of claim 1, wherein said source provides an electrical signal having frequencies in the range of about 1 to 30 GHz.

4. The apparatus of claim 2, said source being tunable to any desired frequency within a predetermined range.

5. The apparatus of claim 1, wherein said source is tunable to provide a signal at different frequencies but of substantially the same amplitude.

6. The apparatus of claim 1, wherein said source is tunable to provide a signal of different amplitudes but at substantially the same frequency.

7. The apparatus of claim 1, wherein said measuring means is a spectrum analyzer or network analyzer.

8. The apparatus of claim 1, one of said electrodes having a tip spaced apart by vacuum, a gas or fluid from the substance, said apparatus further comprising:
   feedback means for deriving an error signal from the current or voltage measured by the measuring means and the signal provided by the source; and
   means for moving the tip to change the distance between the tip and the substance in response to the error signal in order to reduce the error signal.

9. The apparatus of claim 1, wherein said substance is an insulator layer, and wherein the pair of electrodes are attached to the layer to form a Coulomb blockade device, said amplitudes across the spectrum measured indicating the threshold phenomena and rates of motion of electrical charges in the device.

10. The apparatus of claim 1, wherein said substance is undergoing electrochemical changes, said apparatus further comprising an electrochemical cell containing the substance, a reference electrode, and wherein said pair of electrodes are the working and counter electrodes of the cell, so that the amplitudes of the current or voltage across the pair measured over said spectrum reveal dynamic information concerning the changes.

11. The apparatus of claim 1, further comprising means for storing atomic or molecular spectra of a known substance for comparison with atomic or molecular spectra of an unknown substance detected by the measuring means to detect the unknown substance.

12. A method for detecting threshold phenomena associated with and/or atomic or molecular spectra of a substance by means of at least two electrodes across the substance, said method comprising:
   providing an AC electrical signal to the pair of electrodes; and
   measuring the amplitudes of the current or voltage across the electrodes over a predetermined spectrum of frequencies to detect threshold phenomena associated with and/or atomic or molecular spectra of the substance.

13. The method of claim 12, further comprising repeating the signal providing step where the signals provided in the signal providing steps are of different frequencies, and repeating the measuring step at each of said different frequencies of the signal.

14. The method of claim 13, wherein the amplitude of the signal provided remains substantially unchanged when the signal providing step is repeated.

15. The method of claim 13, further comprising determining an optimal frequency of the signal for differentiating different surfaces species or for obtaining images of said surfaces.

16. The method of claim 15, wherein said providing step is performed using a tunable source of microwave AC signals, said method further comprising tuning the source to the optimal frequency before said providing step is repeated.

17. The method of claim 16, further comprising scanning the substance when said providing step is repeated in a constant current or constant height mode to obtain an image of the substance.

18. The method of claim 13, wherein said the providing and measuring steps are repeated where the frequency of the electrical signal provided in the providing steps is varied, in order to detect rates of motion of charges in the substance.

19. The method of claim 18, wherein the frequency of the electrical signal provided in the providing steps is continually reduced, said method further comprising comparing the amplitudes of high harmonics and those of low harmonics, when the frequency of the signal provided in the providing step is continually reduced.

20. The method of claim 12, further comprising repeating the signal providing step where the signals provided in the signal providing steps are of substantially the same frequency but different amplitudes, and repeating the measuring step at each of said different amplitudes of the signal.

21. The method of claim 20, wherein the signal providing step is repeated so that the amplitude of the signal is varied for each providing step compared to the previous providing step, said method further comprising detecting a sudden change in current or voltage at a selected frequency across the electrodes when the amplitudes of the signal is varied to detect a threshold of the substance.

22. The method of claim 21, wherein the amplitude of the signal provided in the providing step is continually increased, said method further comprising comparing the amplitudes of high harmonics and those of low harmonics, when the amplitude of the signal provided in the providing step is continually increased.

23. An apparatus for detecting threshold phenomena associated with and/or atomic or molecular spectra of a substance, comprising:
   a tunable source for providing an AC electrical signal at a selected frequency;
   at least two electrodes for coupling said signal across a substance; and
   means connected to at least one of the electrodes for measuring the amplitudes of the current or voltage at said selected frequency to detect threshold phenomena associated with and/or atomic or molecular spectra of the substance.

24. The apparatus of claim 23, wherein said measuring means is a network analyzer.

* * * * *